(12) United States Patent
Pan

(10) Patent No.: US 6,281,554 B1
(45) Date of Patent: Aug. 28, 2001

(54) ELECTROSTATIC DISCHARGE PROTECTION CIRCUIT

(75) Inventor: Jui-Hsiang Pan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/531,905

(22) Filed: Mar. 20, 2000

(51) Int. Cl.⁷ ............................. H01L 23/62; H01L 29/76
(52) U.S. Cl. ......................... 257/357; 257/371; 257/355
(58) Field of Search ................................. 257/355–362, 257/371

(56) References Cited

U.S. PATENT DOCUMENTS 5,689,132 * 11/1997 Ichikawa ............................. 257/357

FOREIGN PATENT DOCUMENTS 2-234462 * 9/1990 (JP) ............................. H01L/27/092

* cited by examiner

Primary Examiner—William Mintel
Assistant Examiner—Ori Nadav
(74) Attorney, Agent, or Firm—Jiawei Huang; J.C. Patents

(57) ABSTRACT

A high-voltage electrostatic discharge protection circuit according to the invention has the following structure. A first high-voltage N-well region, a first high-voltage P-well region, a second high-voltage N-well region and a second high-voltage P-well region are adjacent to each other. A PMOS transistor is formed on the first high-voltage N-well region and has its source electrically connected to a high voltage and its drain electrically connected to an input/output pad. A first isolation region is formed between the first high-voltage N-well region and the first high-voltage P-well region and electrically connected to the drain of the PMOS transistor. A first N⁺-type region is formed between the first high-voltage P-well region and the second high-voltage N-well region, adjacent to the first isolation region and electrically connected to the input/output pad. A polysilicon gate region is formed on the second high-voltage N-well region, adjacent to the first N⁺-type region and electrically connected to the gate of the PMOS transistor. An NMOS transistor has its drain located between the second high-voltage N-well region and the second high-voltage P-well region and adjacent to the polysilicon gate region and its gate and source located on the second high-voltage P-well region, wherein the drain is electrically connected to the input/output pad, the gate is electrically connected to the polysilicon gate region and the source is electrically connected to a ground voltage.

4 Claims, 4 Drawing Sheets

ELECTROSTATIC DISCHARGE PROTECTION CIRCUIT

BACKGROUND OF THE INVENTION

1. Field of the Invention

The invention relates to an electrostatic discharge protection circuit, and more particularly to a gate coupled electrostatic discharge protection circuit which is formed with parasitic capacitors generated using a principle of gate couple, to ensure that parasitic bipolar junction transistors can be speedily turned on to protect a related high-voltage device from damages.

2. Description of the Prior Art

In semiconductor industry, electrostatic discharge (ESD) is always a main reason to cause damages on ICs during manufacturing. For example, under an environment with higher relative humidity (RH), there will be several hundred, even several thousand, voltages of electrostatic charges detected when a person walks through a rug. In an environment with lower relative humidity, electrostatic charges will reach more than ten thousand voltages. When the rug or person bringing high-voltage electrostatic charges contacts a chip, the electrostatic charges will be discharged toward the chip, causing irretrievable damages on the chip. To prevent chips from any damages caused by electrostatic charge discharge, various electrostatic discharge protection circuits have been developed. Typically, in the prior art, an on-chip electrostatic discharge protection circuit is designed between an internal circuit and each pad for protecting the internal circuit from damages.

Referring to FIG. 1, a structure of a conventional high-voltage electrostatic discharge protection circuit is shown. In the conventional high-voltage electrostatic discharge protection circuit, a high-voltage N-well region 12 and a high-voltage P-well region 14 adjacent to each other are formed in an N-type substrate 10. A PMOS transistor 16 is formed on the high-voltage N-well region 12. The PMOS transistor 16 has its gate 18 and source 20 electrically connected to a high voltage $V_{DD}$, together and its drain electrically connected to an input/output pad (I/P PAD) 23.

The source 20 is constructed by a $P^+$-type region 24, a P-grad region 26 and a P-drift region 28. The P-grade region 26 is beneath and sounding the $P^+$-type region 24. The P-drift region 28 is adjacent to the P-grade region 26, partly under the gate 18. Similarly, the drain 22 is constructed by a $P^+$-type region 30, a P-grade region 32 and a P-drift region 34. The P-grade region 32 is beneath and surrounding the $P^+$-type region 30. The P-grade region 32 is beneath and surrounding the $P^+$-type region 30. The P-drift region 34 is adjacent to the P-grade region 32, partly under the gate 18. Furthermore, on the high-voltage N-type well region 12, there are an $N^+$-base connection region 38 electrically connected to the high voltage $V_{DD}$ and a first isolation region 36, wherein the source 20 and the $N^+$-base connection region 38 are adjacent to both sides of the first isolation region 36.

Similarly, an NMOS transistor 42 is formed on the high-voltage P-well region 14. The NMOS transistor 42 has its gate 44 and source 46 electrically connected to ground $V_{SS}$, together and its drain 48 electrically connected to the input/output pad 23. The drain 48 is constructed by an $N^+$-type region 50, an N-grade region 52 and an N-drift region 54. The N-grade region 52 is beneath and surrounding the $N^+$-type region 50. The N-type drift region 54 is adjacent to the N-grade region 52, partly under the gate 42. The source 46 is constructed by an $N^+$-type region 56, an N-grade region 58 and an N-drift region 60. The N-grade region 58 is beneath and surrounding the $N^+$-type region 56. The drift region 60 is adjacent to the N-grade region 58, partly under the gate 44. Moreover, on the high-voltage P-well region 14, there are an $P^+$-base connection region 64 electrically connected to the ground $V_{SS}$, wherein the source 46 and the $P^+$-base connection region 64 are adjacent to both sides of a second isolation region 62. Additionally, there is a third isolation region 40 is formed on the N-type substrate 10 and between the high-voltage N-well region 12 and the high-voltage P-well region 14. In other words, the drain 22 of the PMOS transistor 16 and the drain 48 of the NMOS transistor 42 are located on both sides of the third isolation region 40.

Due to the requirement of high-voltage process, the P-well region 14 is formed with high resistance. Consequently, two parasitic bipolar junction transistors 66, 68 shown in FIG. 1 have a higher breakdown voltage (BV). Meanwhile, as shown in FIG. 2, the gates of the PMOS transistor 16 and the NOMS transistor are electrically connected to $V_{DD}$ and $V_{SS}$. As a result, it is uneasy to turn on the parasitic bipolar transistors 66 and 68 to release electrostatic charges in a short time.

SUMMARY OF THE INVENTION

In view of the above, the invention is to provide a high-voltage electrostatic discharge protection circuit, which is formed with parasitic capacitors generated using a principle of gate couple, to ensure that parasitic bipolar junction transistors can be speedily turned on to protect a related high-voltage device from damages.

A high-voltage electrostatic discharge protection circuit according to the invention has the following structure. A first high-voltage N-well region, a first high-voltage P-well region, a second high-voltage N-well region and a second high-voltage P-well region are adjacent to each other. A PMOS transistor is formed on the first high-voltage N-well region and has its source electrically connected to a high voltage and its drain electrically connected to an input/output pad. A first isolation region is formed between the first high-voltage N-well region and the first high-voltage P-well region and electrically connected to the drain of the PMOS transistor. A first $N^+$-type region is formed between the first high-voltage P-well region and the second high-voltage N-well region, adjacent to the first isolation region and electrically connected to the input/output pad. A polysilicon gate region is formed on the second high-voltage N-well region, adjacent to the first $N^+$-type region and electrically connected to the gate of the PMOS transistor. An NMOS transistor has its drain located between the second high-voltage N-well region and the second high-voltage P-well region and adjacent to the polysilicon gate region and its gate and source located on the second high-voltage P-well region, wherein the drain is electrically connected to the input/output pad, the gate is electrically connected to the polysilicon gate region and the source is electrically connected to a ground voltage.

BRIEF DESCRIPTION OF THE DRAWINGS

The invention will become more fully understood from the detailed description given hereinafter and the accompanying drawings which are given by way of illustration only, and thus do not limit the present invention, and wherein.

DETAILED DESCRIPTION OF THE PREFERRED EMBODIMENTS

Figure 1:
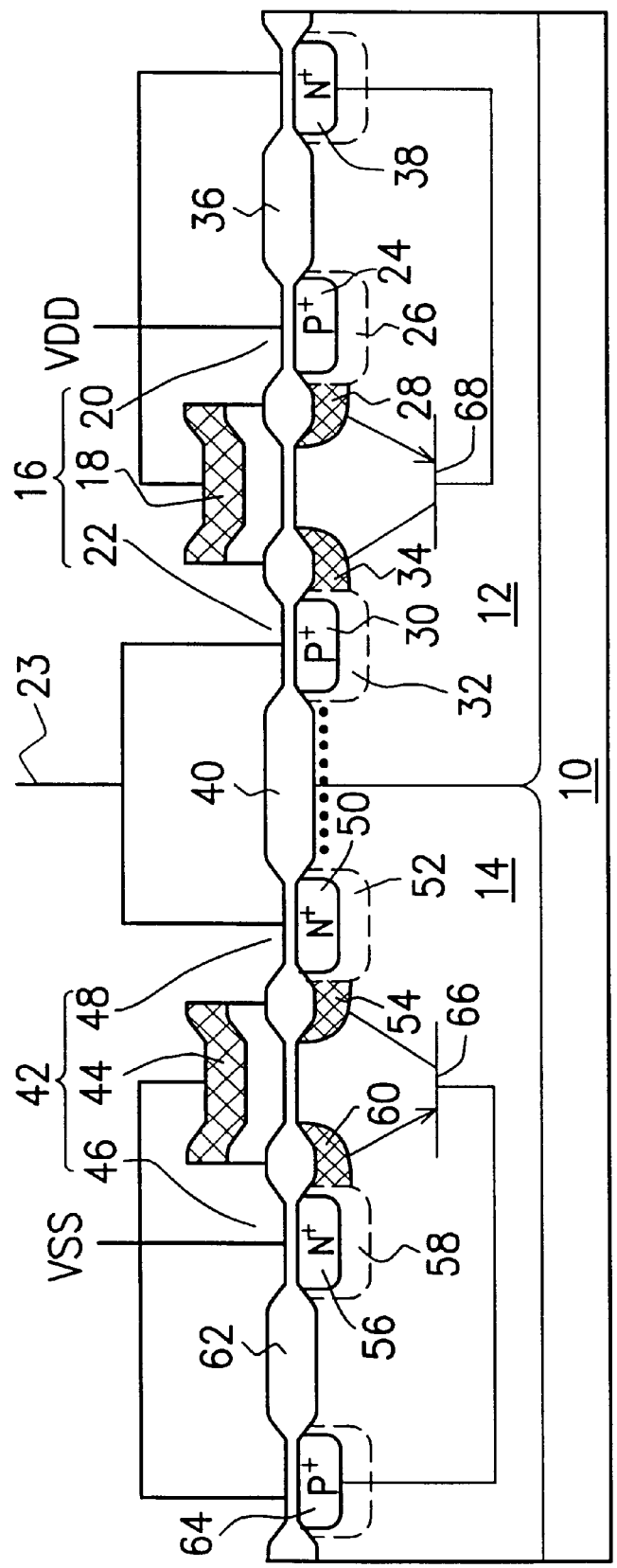
FIG. 1 is a schematic, cross-sectional view showing a structure of a high-voltage electrostatic discharge protection circuit according to the prior art.
Figure 2:
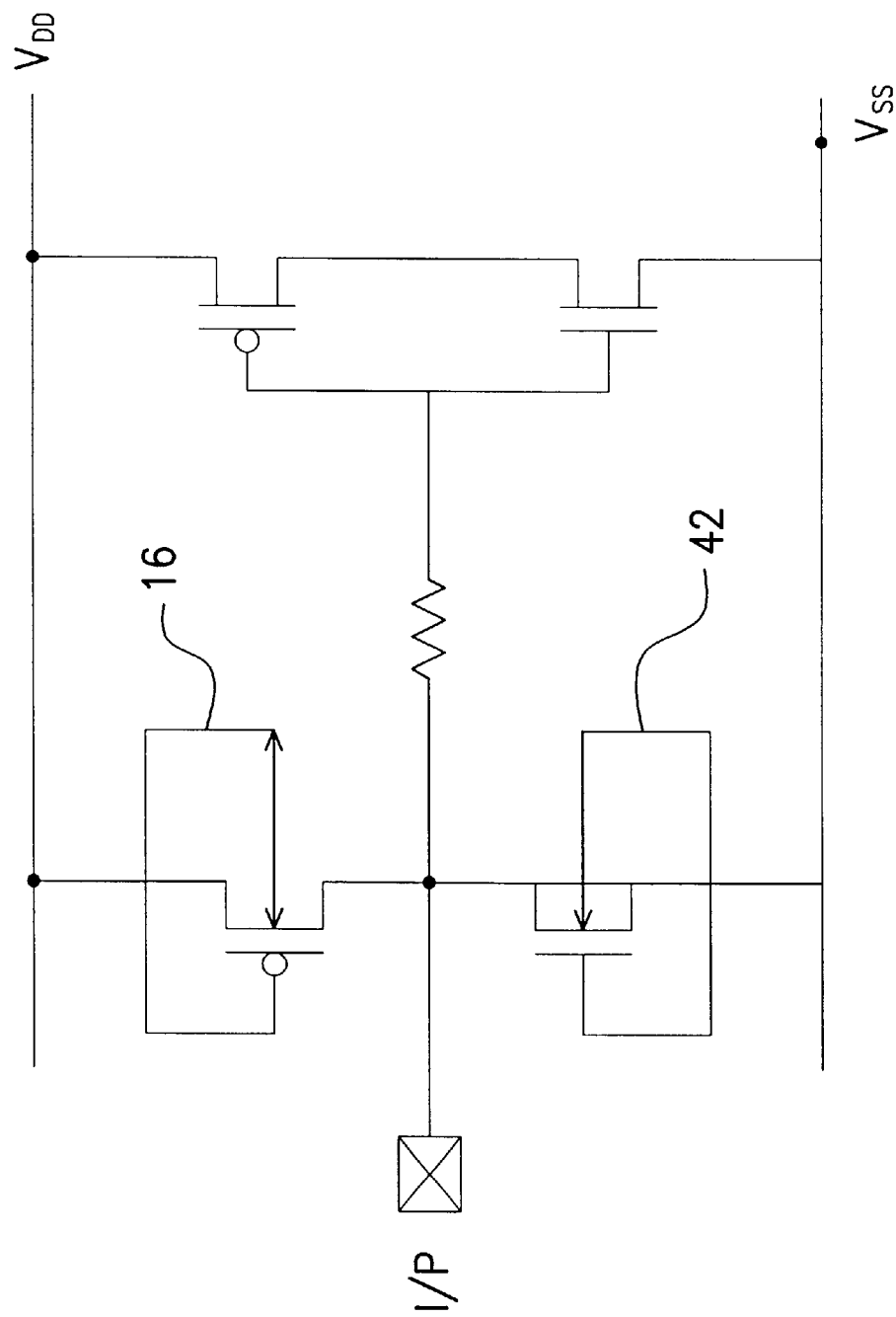
FIG. 2 is a circuit diagram corresponding to the structure of FIG. 1.
Figure 3:
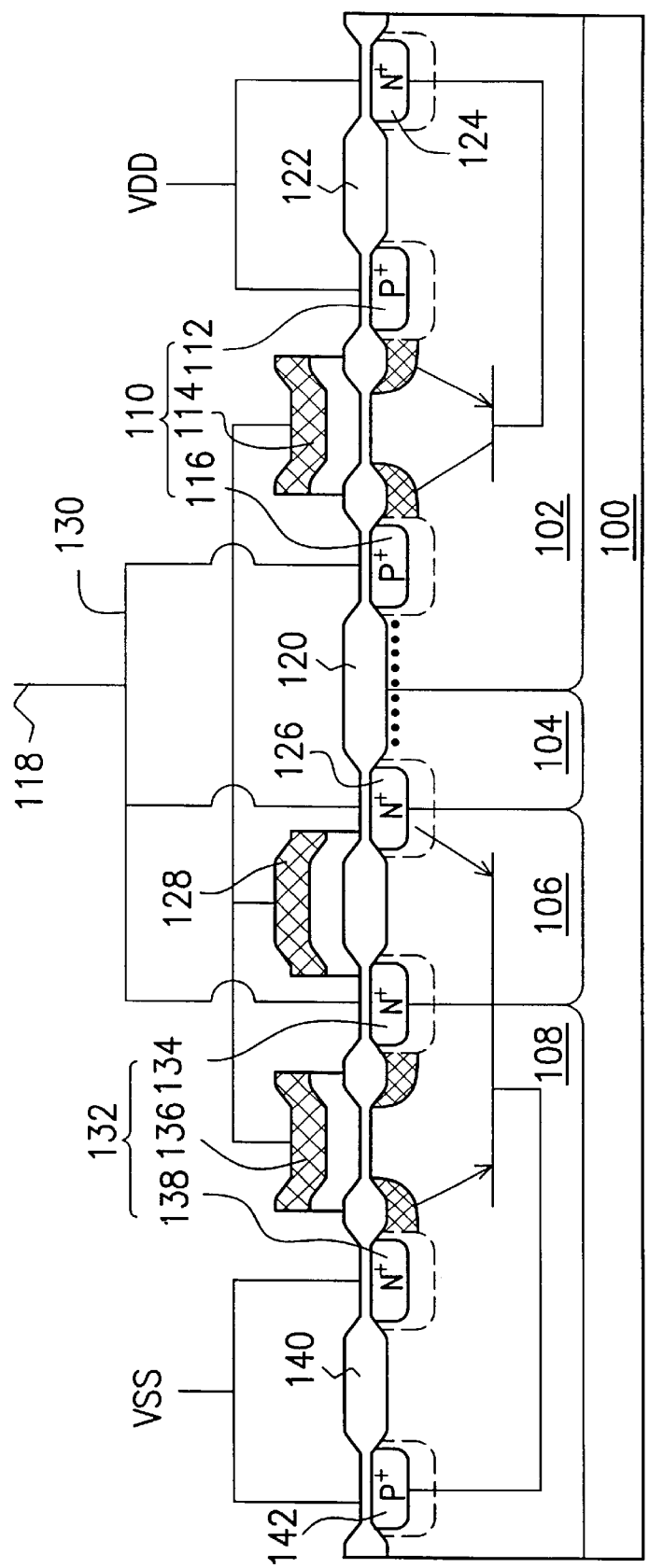
FIG. 3 is a schematic, cross-sectional view of a structure of a high-voltage electrostatic discharge protection circuit according to a preferred embodiment of the invention.

Referring to FIG. 3, a high-voltage electrostatic discharge protection circuit according to a preferred embodiment of the invention is shown. In FIG. 3, a first high-voltage N-well region 102, a first high-voltage P-well region 104, a second high-voltage N-well region 106 and a second high-voltage P-well region 108 adjacent to each other are formed in an N-type substrate 100.

Moreover, a PMOS transistor 110 is formed on the first high-voltage N-well region 102 and has its source 112 electrically connected to a high voltage $V_{DD}$, its drain 116 electrically connected to an input/output pad (I/P PAD) 118 and its gate 114 located between the drain 116 and the source 112.

Similarly, an NMOS transistor 132 is formed on the second high-voltage P-well region 108 and has its source 138 electrically connected to ground $V_{SS}$, its drain 134 electrically connected to the input/output pad (I/P PAD) 118 and its gate 136 located between the drain 134 and the source 138.

A first $N^+$-type region 126 is formed on the N-type substrate 100 and between the second high-voltage N-well region 106 and the first high-voltage P-well region 104 and electrically connected to the P-grade region 118. A polysilicon gate region 128 is formed on the second high-voltage N-well region 106, adjacent to the drain 134 and the first $N^+$-type region 126 and electrically connected to the gates 136 and 114.

Moreover, a first isolation region 120 is formed on the N-type substrate 100 and adjacent to the first $N^+$-type region 126 and the $P^+$-type region 116. A second isolation region 122 is formed on the first high-voltage N-well region 102 and has the source 112 and an $N^+$-type base connection region 124 located on both sides thereof, wherein the $N^+$-type base connection region 124 is electrically connected to the high voltage $V_{DD}$. A third isolation region 140 is formed on the second high-voltage P-well region 108 and has the source 138 and a $P^+$-type base connection region 142 located on both sides thereof, wherein the $P^+$-type base connection region 142 is electrically connected to ground $V_{SS}$.

Figure 4:
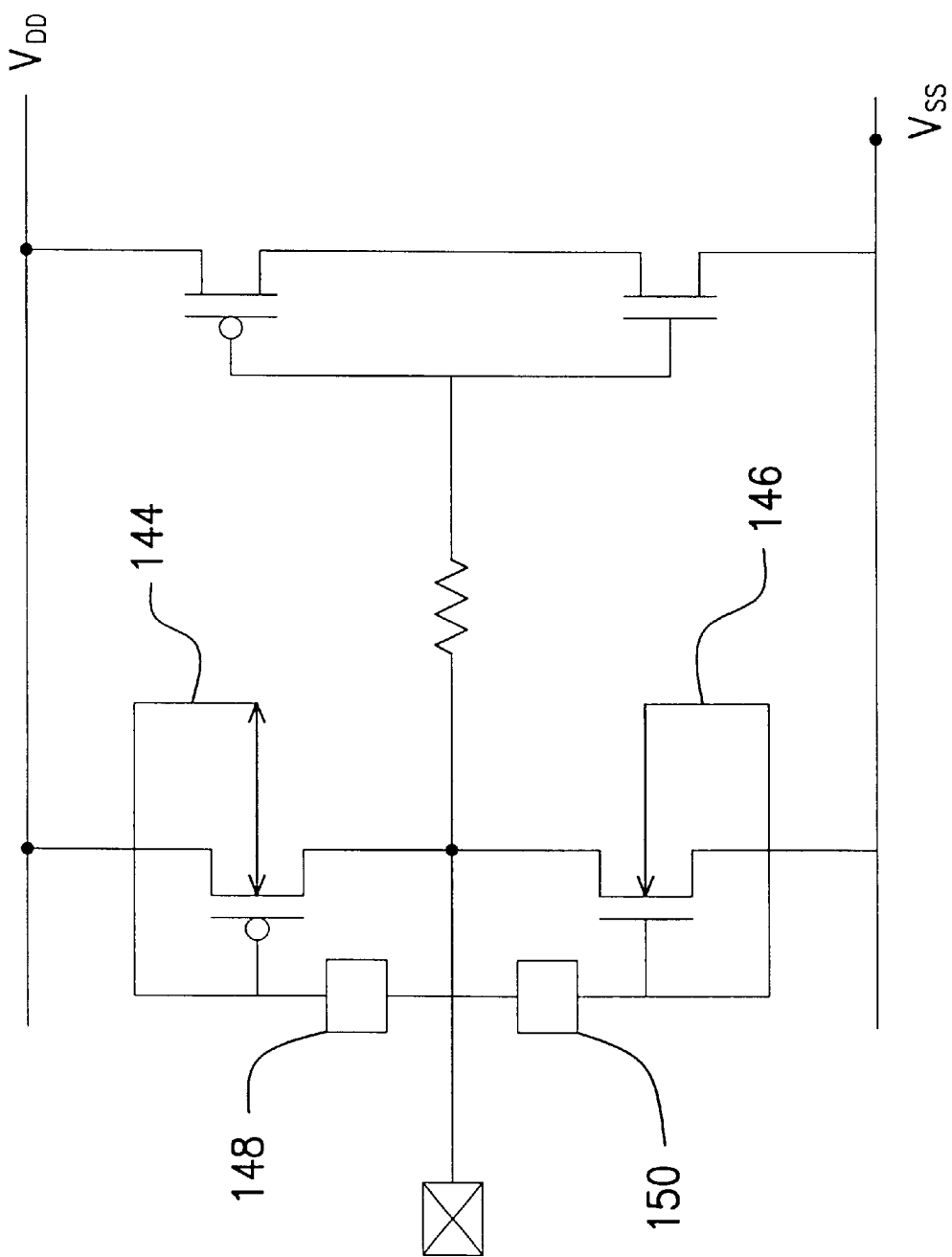
FIG. 4 is a circuit diagram corresponding to the structure of FIG. 3.

Referring now to FIG. 4, a circuit diagram of the high-voltage electrostatic discharge protection circuit of FIG. 3 is shown. In FIG. 4, transistors 144 and 146 are corresponding to the PMOS transistor 110 and the NMOS transistor of FIG. 3. Furthermore, parasitic capacitors 148 and 150 are formed under the polysilicon gate region 128 thereby to ensure that parasitic bipolar junction transistors can be speedily turned on to protect a related high-voltage device from damages.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A high-voltage electrostatic discharge protection circuit comprising:
   a first high-voltage N-well region;
   a first high-voltage P-well region adjacent to the first high-voltage N-well region;
   a second high-voltage N-well region adjacent to the first high-voltage P-well region;
   a second high-voltage P-well region adjacent to the second high-voltage N-well region;
   a PMOS transistor formed on the first high-voltage N-well region and having its source electrically connected to a high voltage and its drain electrically connected to an input/output pad;
   a first isolation region formed between the first high-voltage N-well region and the first high-voltage P-well region and electrically connected to the drain of the PMOS transistor;
   a first $N^+$-type region formed between the first high-voltage P-well region and the second high-voltage N-well region, adjacent to the first isolation region and electrically connected to the input/output pad;
   a polysilicon gate region formed on the second high-voltage N-well region, adjacent to the first $N^+$-type region and electrically connected to the gate of the PMOS transistor; and
   an NMOS transistor having its drain located between the second high-voltage N-well region and the second high-voltage P-well region and adjacent to the polysilicon gate region and its gate and source located on the second high-voltage P-well region, wherein the drain is electrically connected to the input/output pad, the gate is electrically connected to the polysilicon gate region and the source is electrically connected to a ground voltage.

2. The high-voltage electrostatic discharge protection circuit as claimed in claim 1, further comprising an N-type substrate where the first high-voltage N-well region, the first high-voltage P-well region, the second high-voltage N-well region and the second high-voltage P-well region.

3. The high-voltage electrostatic discharge protection circuit as claimed in claim 1, further comprising:
   a second isolation region located on the first high-voltage N-well region and electrically connected to the source of the PMOS transistor; and
   an $N^+$ base connection region located on the first high-voltage N-well region, adjacent to the second isolation region and electrically connected to the high voltage.

4. The high-voltage electrostatic discharge protection circuit as claimed in claim 1, further comprising:
   a third isolation region located on the second high-voltage P-well region and electrically connected to the source of the NMOS transistor; and
   a $P^+$ base connection region located on the second high-voltage P-well region, adjacent to the third isolation region and electrically connected to the ground voltage.

* * * * *